United States Patent
Kintigh et al.

(10) Patent No.: US 11,043,944 B1
(45) Date of Patent: Jun. 22, 2021

(54) SYSTEM AND METHOD EMPLOYING LOW DISTORTION AND LOW LOSS SWITCH WITH ANTI-SERIES DIODES

(71) Applicant: LOCKHEED MARTIN CORPORATION, Bethesda, MD (US)

(72) Inventors: Dana W. Kintigh, Hingham, MA (US); Brian R. Dube, Londonderry, NH (US); Laurence J. Richard, Ashby, MA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 2 days.

(21) Appl. No.: 16/540,537

(22) Filed: Aug. 14, 2019

(51) Int. Cl.
*H01P 1/15* (2006.01)
*H03K 17/76* (2006.01)
*H03G 1/00* (2006.01)
*H04B 1/44* (2006.01)

(52) U.S. Cl.
CPC ........... *H03K 17/76* (2013.01); *H03G 1/0058* (2013.01); *H04B 1/44* (2013.01)

(58) Field of Classification Search
CPC .................................. H01P 1/15; H03K 17/76
USPC .......................................... 333/101, 103–105
See application file for complete search history.

(56) References Cited

U.S. PATENT DOCUMENTS

| | | |
|---|---|---|
| 5,103,195 A | 4/1992 | Dunsmore |
| 5,212,408 A | 5/1993 | Even-or |
| 5,834,988 A | 11/1998 | Dobrovolny |
| 5,990,761 A * | 11/1999 | Hamparian ............... H03H 7/20 327/237 |
| 7,023,294 B2 | 4/2006 | Hauger et al. |

(Continued)

FOREIGN PATENT DOCUMENTS

| | | |
|---|---|---|
| CN | 203734610 | 7/2014 |
| CN | 106788308 | 5/2017 |
| JP | 2000208699 | 1/2002 |

OTHER PUBLICATIONS

Huang, Cong, et al. "A 67 dBm multistacked junction varactor." IEEE Microwave and Wireless Components Letters 18.11 (2008): 749-751.

(Continued)

*Primary Examiner* — Dean O Takaoka
(74) *Attorney, Agent, or Firm* — Terry M. Sanks, Esq.; Beusse Sanks, PLLC

(57) ABSTRACT

A switch comprising a first switching circuit assembly having a first pair of identical diodes in first anti-series configuration. The first switching circuit assembly constructed and arranged to cancel capacitance change wherein capacitance increases in a first diode of the first pair of identical diodes and, simultaneously, capacitance decreases in a second diode of the first pair of identical diodes with a first selectively applied radio frequency (RF) voltage input. The switch comprises a second switching circuit assembly having a second pair of identical diodes in second anti-series configuration. The second switching circuit assembly constructed and arranged to cancel capacitance change wherein capacitance increases in a first diode of the second pair of identical diodes and, simultaneously, capacitance decreases in a second diode of the second pair of identical diodes with a second selectively applied RF voltage input. A system and method are also provided.

20 Claims, 6 Drawing Sheets

(56) References Cited

U.S. PATENT DOCUMENTS

| | | | |
|---|---|---|---|
| 7,567,120 B2 * | 7/2009 | Kottschlag | H03J 3/185 |
| | | | 327/586 |
| 9,077,337 B2 | 7/2015 | Richt | |
| 9,941,256 B1 | 4/2018 | Ettingshausen et al. | |
| 2006/0268479 A1 | 11/2006 | Bischof | |
| 2018/0013425 A1 | 1/2018 | Foley et al. | |
| 2019/0035778 A1 | 1/2019 | Reznicek et al. | |

OTHER PUBLICATIONS

Waugh, R. (1991, Feb.). A low distortion PIN diode switch using surface mount devices. In Proceedings of RF Expo West (pp. 455-461).

Buisman, K., et al. "Distortion-free varactor diode topologies for RF adaptivity." IEEE MTT-S Int. Microw. Symp. Dig. 2005.

\* cited by examiner

SYSTEM AND METHOD EMPLOYING LOW DISTORTION AND LOW LOSS SWITCH WITH ANTI-SERIES DIODES

BACKGROUND

Embodiments relate to a system and a method employing low distortion and low loss switches with anti-series diodes.

PIN diode switches generate a second harmonic distortion that can cause compliance issues with both industrial and military requirements. For moderate transmitter power level of 10 to 50 W the harmonic generated in current switches is about −40 dBc (decibels relative to the carrier). This level cannot be reduced with different diode characteristics.

Military systems may require −60 dBc or greater for some communication systems. A narrow band system (less than an octave bandwidth) can use output filters. However, a multiband system (greater than an octave) would require the use of selectable filters at the transmitter output which would require a switch, most often a PIN diode switch, thereby creating excessive harmonics.

SUMMARY

Embodiments relate to a system and a method employing low distortion and low loss switches with anti-series diodes.

An aspect of the embodiments includes a switch comprising a first switching circuit assembly having a first pair of identical diodes in first anti-series configuration. The first switching circuit assembly constructed and arranged to cancel capacitance change wherein capacitance increases in a first diode of the first pair of identical diodes and, simultaneously, capacitance decreases in a second diode of the first pair of identical diodes with a first selectively applied radio frequency (RF) voltage input. The switch comprises a second switching circuit assembly having a second pair of identical diodes in second anti-series configuration. The second switching circuit assembly constructed and arranged to cancel capacitance change wherein capacitance increases in a first diode of the second pair of identical diodes and, simultaneously, capacitance decreases in a second diode of the second pair of identical diodes with a second selectively applied RF voltage input.

An aspect of the embodiments includes a system comprising transmitters configured to selectively transmit a first selectively applied radio frequency (RF) voltage input and a second selectively applied RF voltage input. The system includes a switch comprising a first switching circuit assembly having a first pair of identical diodes in first anti-series configuration. The first switching circuit assembly is constructed and arranged to cancel capacitance change. The capacitance increases in a first diode of the first pair of identical diodes and, simultaneously, capacitance decreases in a second diode of the first pair of identical diodes with the first selectively applied RF voltage input. The switch includes a second switching circuit assembly having a second pair of identical diodes in second anti-series configuration. The second switching circuit assembly is constructed and arranged to cancel capacitance change. The capacitance increases in a first diode of the second pair of identical diodes and, simultaneously, capacitance decreases in a second diode of the second pair of identical diodes with the second applied RF voltage input.

Another aspect of the embodiments includes a method comprising selectively transmitting, by transmitters, a first selectively applied radio frequency (RF) voltage input and a second selectively applied RF voltage input; and switching by a switch, one of the first selectively applied RF voltage input and the second selectively applied RF voltage input to a switch output. The switch comprises a first switching circuit assembly having a first pair of identical diodes in first anti-series configuration, and a second switching circuit assembly having a second pair of identical diodes in second anti-series configuration. The method includes cancelling by the first switching circuit assembly a capacitance change wherein capacitance increases in a first diode of the first pair of identical diodes and, simultaneously, capacitance decreases in a second diode of the first pair of identical diodes with the first selectively applied RF voltage input. The method includes cancelling by the second switching circuit assembly capacitance change wherein capacitance increases in a first diode of the second pair of identical diodes and, simultaneously, capacitance decreases in a second diode of the second pair of identical diodes with the second applied RF voltage input.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
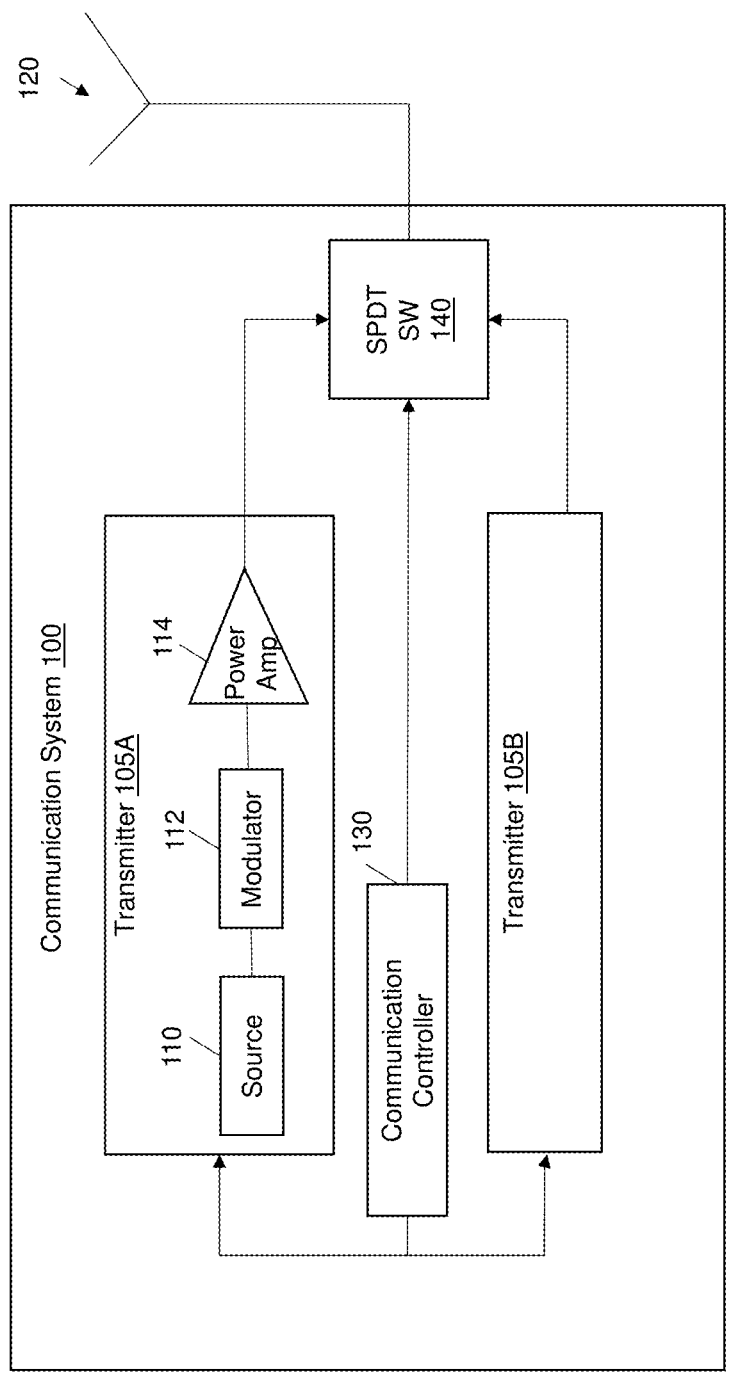
FIG. 1 illustrates a multiband radio frequency (RF) transmitter communication system.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of 0 and the maximum value of 10, that is, any and all sub-ranges having a minimum value of equal to or greater than 0 and a maximum value of equal to or less than 10, e.g., 1 to 4.

FIG. 1 illustrates a multiband radio frequency (RF) transmitter communication system 100. The system 100 comprises a plurality of transmitters 105A and 105B coupled to an antenna 120 via a single pole double throw (SPDT) switch 140. The multiband RF communication system 100 may be configured to operate in the C-Band and X-Band. For example, the C-Band may include approximate frequencies in the 4-8 gigahertz (GHz) frequency range. The X-Band may include approximate frequencies in the 8-12 GHz frequency range. The transmitters 105A and 105B may communicate on different bands selected from the C-Band and the X-Band. The switch 140 is configured to accommodate multiple octaves in the gigahertz frequency range.

Satellite communication whether for Internet communications, mobile communications, or general satellite communications, generally uses the C-Band and X-Band frequency range. Satellite communications may include voice, video and data communication signals. Multiband transmitters used in, by way of non-limiting example, Military Communication Systems and RADARs require low harmonic outputs to be compliant with the MIL requirements.

The inventors have determined that current switch designs do not meet the low harmonic levels required for military communication systems such as in the range of −40 decibels to the carrier (dBc) to −60 dBc. By way of non-limiting example, the SPDT switch 140 is configured to produce output harmonics or harmonic distortions limited to −40 dBc to −60 dBc.

Each transmitter 105A or 105B may include a signal source 110 and a modulator 112 configured to modulate the signal from the signal source 110. The type of signal and modulation are not the focus affecting distortion and power loss in the communication system 100 described herein. Thus, no further discussion will be provided. The transmitter 105A or 105B may include a power amplifier 114 having an output coupled to switch 140.

The communication system 100 may include a communication controller 130 configured to control the operation of transmitters 105A and 105B and switch 140 to selectively switch the input of the antenna 120 between the output paths of transmitters 105A and 105B.

The embodiment of FIG. 1, for simplicity, describes the operation of system 100 with two transmitters 105A and 105B using switch 140. However, based on the principals described herein the communication system may include more than two transmitters and the switch 140 may be modified to have a single pole, multi-throw (SPMT) switch.

The communication system 100 may be part of a transceiver including at least one receiver and at least one antenna.

Figure 2:
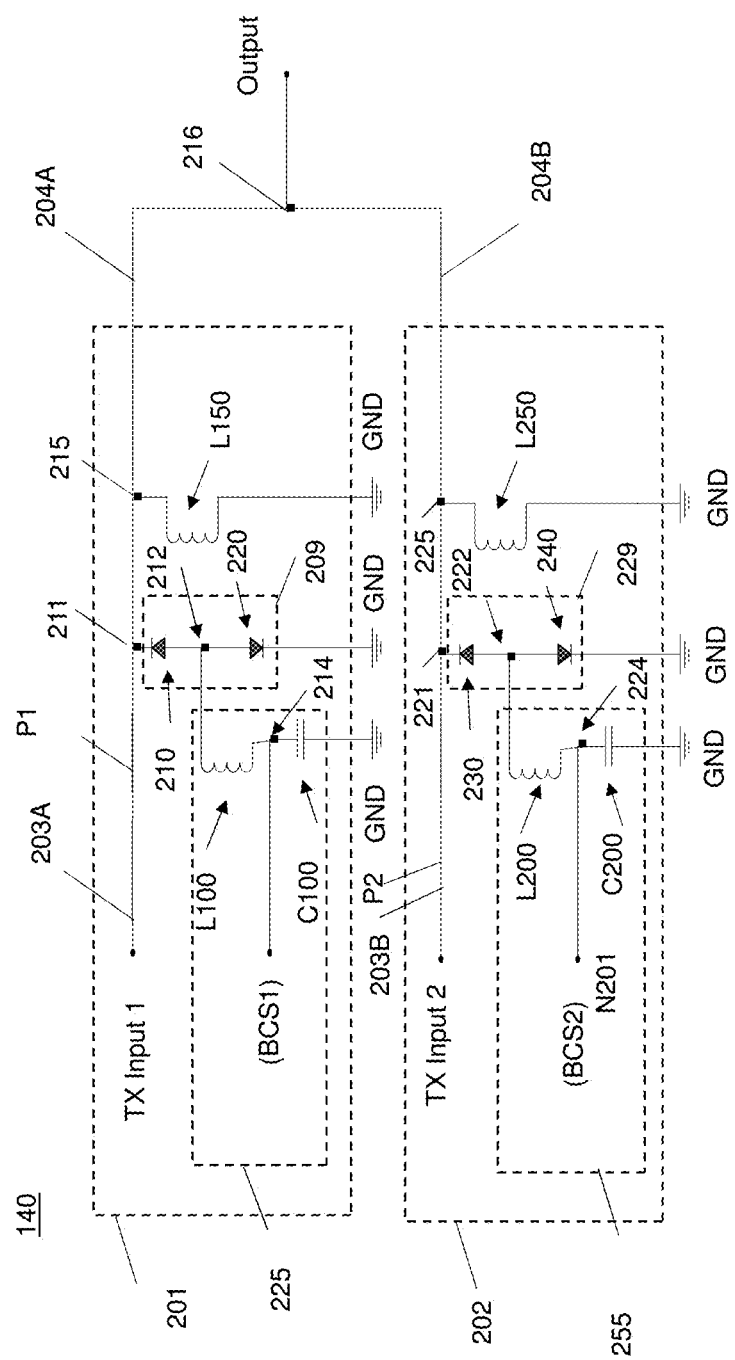
FIG. 2 illustrates a single pole double throw (SPDT) switch for use in the multiband RF systems of FIG. 1.

FIG. 2 illustrates a single pole double throw (SPDT) switch 140 for use in the multiband RF communication system of FIG. 1. The SPDT switch 140 includes PIN diodes being constructed and arranged which improves harmonic performance. Specifically, the anti-parallel diodes as described herein result in first-order harmonic cancellation. The switch 140 will be described in relation to transmitting signals with two inputs and a single output.

The first switching circuit assembly 201 of the SPDT switch 140 will now be described. A first input signal is delivered to node 211. Node 211 is coupled to the cathode of diode 210. The anode of diode 210 is coupled to node 212. Node 212 is also coupled to the anode of diode 220. The cathode of diode 220 is coupled to ground (GND).

Node 212 is coupled to a first bias control circuit assembly 225 configured to reverse bias the control signal delivered at node 212. The first bias control circuit assembly 225 includes an inductor L100 having one end coupled to node 212. The other end of the inductor L100 is coupled to node 214. Node 214 is coupled to capacitor C100 which is, in turn, coupled to ground (GND).

Returning again to node 211 in the first input path, an electrical path is established to an output (Out) at node 216. In the first input path P1, there is node 215 being coupled to one side of inductor L150. The other end of inductor L150 is coupled to ground (GND).

The configuration of diode 210 and 220 forms an anti-series diode stack 209. The second switching circuit assembly 202 of the SPDT switch 140 will now be described. A second input signal is delivered to node 221. Node 221 is coupled to the cathode of diode 230. The cathode of diode 230 is coupled to node 222. Node 222 is also coupled to the anode of diode 240. The cathode of diode 240 is coupled to ground (GND).

Node 222 is coupled to a second bias control circuit assembly 255 configured to forward bias the control signal delivered at node 222. The second bias control circuit assembly 255 includes an inductor L200 having one end coupled to node 222. The other end of the inductor L200 is coupled to node 224. Node 224 is coupled to capacitor C200 which is, in turn, coupled to ground (GND).

Returning again to node 221 in the first input path, an electrical path is established to an output (Out) at node 216. In the second input path, there is node 225 being coupled to one side of inductor L250. The other end of inductor L250 is coupled to ground (GND).

The configuration of diode 230 and 240 forms an anti-series diode stack 229.

The inventors have determined that the reverse biased diode is the limiting factor for performance in switch 140 wherein the forward biased diode generates lower harmonics.

Specifically, the switch 140 may comprise a first switching circuit assembly 201 having a first pair of identical diodes 210, 220 in first anti-series configuration. The first switching circuit assembly 201 may be constructed and arranged to cancel capacitance change wherein capacitance increases in a first diode of the first pair of identical diodes 210, 220 and, simultaneously, capacitance decreases in a second diode of the first pair of identical diodes with a first selectively applied radio frequency (RF) voltage input 203A.

The switch 140 may comprise a second switching circuit assembly 202 having a second pair of identical diodes in second anti-series configuration. The second switching circuit assembly 202 constructed and arranged to cancel capacitance change wherein capacitance increases in a first diode of the second pair of identical diodes and, simultaneously, capacitance decreases in a second diode of the second pair of identical diodes with a second selectively applied RF voltage input 203B.

The switch 140 may further comprise a switch output, at node 216, coupled to a first throw output 204A of the first pair of identical diodes and a second switching output of the second pair of identical diodes wherein a path from the first throw output 204A to the switch output, at node 216, is devoid of a capacitor.

A path from the second throw output 204B to the switch output, at node 216, is devoid of a capacitor. The anti-parallel diodes result in first order harmonic cancellation. Change is replacing a single diode with the mesa to mesa stack and changing the bias arrangement. DC blocking capacitors may be eliminated for lower insertion loss.

The first switching circuit assembly 201 may comprise a first pin diode 210 having a cathode coupled directly to the input path 203A. The first switching circuit assembly 201 may comprise a second pin diode 220 having a cathode connected to ground wherein an anode of the first pin diode 210 and an anode of the second pin diode 220 are coupled in series. The first switching circuit assembly 210 may comprise a first inductor L100 coupled directly to the anode of the first pin diode 210 and being configured to receive a first control bias signal BCS1.

The second switching circuit assembly 202 may comprise a first pin diode 230 having a cathode coupled directly to the input path 203B. The second switching circuit assembly 202 may comprise a second pin diode 240 having a cathode connected to ground wherein an anode of the first pin diode 230 and an anode of the second pin diode 240 are coupled in series. The second switching circuit assembly 202 may comprise a second inductor L200 coupled directly to the anode of the first pin diode 230 and being configured to receive a second control bias signal BCS2.

The first switch input 203A may be coupled to the cathode of the first pin diode 210 of the first switching circuit assembly 201. The second switch input 203B may be coupled to the cathode of the first pin diode 230 of the second switching circuit assembly 202 wherein a path from the first switch input 203A to the first throw output 204A and to the switch output, at node 216, is devoid of a capacitor. The second switch input 203B may be coupled to the cathode of the first pin diode 230 of the second switching circuit assembly 202 wherein a path from the second switch input to the second switching output 204B and to the switch output, at node 216, is devoid of a capacitor.

The harmonic generation of PIN diodes is due to a small change in diode capacitance with the application of a reverse voltage. In a shunt diode switch, the RF voltage swing across the diode causes a capacitance change which creates the harmonics (second, third, etc.). By connecting two identical diodes in anti-series, the capacitance change may be cancelled (one diode capacitance increases with the other decreasing with the applied RF voltage). This results in a significantly reduced harmonic content.

The connection of the diodes may be by a thermal and electrical connection (such as solder) between the mesa of two PIN diodes. The diode stack is essentially equivalent to a single diode with different bias requirements and performs similar to a single diode.

The switch 140 may comprise a first switching circuit assembly 201 and a second switching circuit assembly 202 wherein the circuit assemblies 201 and 202 are essentially identical. Therefore, instead of switch 140 having two inputs, switch may have a plurality of inputs such that each input would be coupled to a switching circuit assembly similar or identical to circuit assembly 201 or 202.

A multiple throw PIN switch can also have a forward biased diode, but in this mode the intercept point is much higher and is not the limiting case for harmonic generation. All multi-throw PIN switches have a combination of forward and reverse biases diodes, so the harmonic creation exists in all designs. Power handling of this approach is comparable to a single diode.

Desired Performance: MIL-STD-461G, Paragraph 5.19.2, RE103 limit for radiated emissions, antenna spurious and harmonic outputs: The second and third harmonics shall be suppressed to a level of −20 dBm or 80 dB below the fundamental, whichever requires less suppression.

The switch 140 is configured to eliminate blocking capacitors in the input path to the output, at node 216. The inductor L100, L150, L200 and L250 have virtually no power loss. Therefore, higher output power, such as the amount of power reaching the antenna, can be accomplished. The system has a higher power added efficiency which the inventors contemplate could reduce DC power, size and weight of the communication system.

The system may use a lower power output amplifier (i.e., power amplifier 114) in the transmitter 105A or 105B which may result in lower cost without sacrificing performance. In some embodiments, the system may use higher reverse bias if even better harmonics are required due to eliminated blocking capacitors (breakdown limited part). Currently, capacitor designs are voltage limited such that capacitors can only receive biases of approximately 50-100 V. The embodiments herein may use 200-300 volts (V) of back (reverse) bias to get lower loss and lower harmonics.

DC blocking capacitors can be eliminated for lower insertion loss. Video transients are greatly diminished (video pulse at the output port). The switch 140 works over a multi-octave bandwidth (i.e., bandwidth in the range of 1-20 GHz). The inductors have little to no power loss. The embodiments have application high power mobile communication such as cellular communication. The embodiments have application in ground jammers and satellite communications.

The embodiments herein result in much better harmonic performance and achieves levels better than −60 dBc and reduces cosite interference (reduces harmonic power falling in-band).

Anti-series works in many other applications, but stacking the diodes mesa to mesa allows for insertion in traditional switch architectures with greatly improved harmonic performance and is a unique solution.

The reverse biased diode is the limiting factor and this simple mechanical idea (stacking) allows significant cancellation of the inherent diode characteristic (capacitance change with bias).

The embodiments have been implemented in a single anti-parallel stack as a single pole single throw switch; two anti-parallel stacks as a single pole double throw switch; C-Band and X-Band data; harmonic reduction is more than 25 dB; and diode is Microsemi part (standard PIN diode).

By way of non-limiting example, a test switch SPDT with regular diode design was measured to have −43 dBc harmonics. However, a stacked diode implementation for an SPDT switch 140 was found to have −70 dBc harmonics. The output second order intercept of 115 dBm vs 88 dBm (decibel per milliwatt). Thus, switch 140 produced an improved second order intercept of 115 dBm as compared to 88 dBm of a regular diode design.

The embodiments are compatible with existing integrated circuit assembly techniques and results in much lower harmonic generation. The harmonics are reduced by the anti-series connection and the reduced RF voltage on each diode (½ the voltage across each diode). The elimination of the DC blocking capacitors results in reduced insertion loss, which can be an important factor in high power switches.

Another benefit of switch 140 is the ability to increase the reverse bias to higher levels than current designs which generally use metal oxide semiconductor (MOS) capacitors with limited breakdown voltage capability. The embodiments result in an improvement in SWaP (size, weight and power). The reduction in switch insertion loss and the elimination of a filter results in higher output power, higher PAE (Power Added Efficiency) which may allow for a lower power final amplifier, as well as a smaller size and lower cost.

The method blocks may be performed in the order shown or a different order. The method blocks may be performed contemporaneously. The method blocks may be omitted, or another block added.

Figure 3:
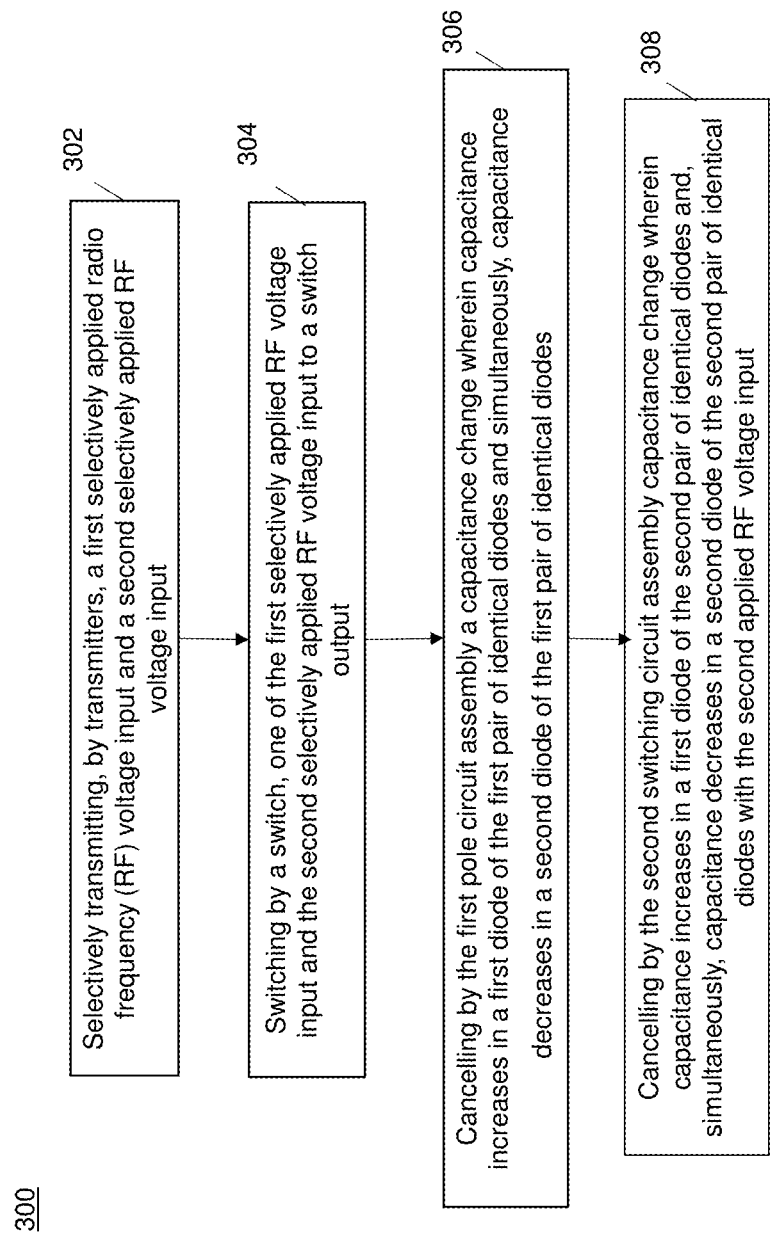
FIG. 3 illustrates a flowchart of switching multiband RF frequencies in a communication system.

FIG. 3 illustrates a flowchart of a method 300 for switching multiband RF frequencies in a communication system. The method 300, at block 302, may include selectively transmitting by transmitters a first selectively applied radio frequency (RF) voltage input and a second selectively applied RF voltage input. The method 300, at block 304, switching by a switch, one of the first selectively applied RF voltage input and the second selectively applied RF voltage input to a switch output. The switch comprises a first switching circuit assembly having a first pair of identical diodes in first anti-series configuration, and a second switching circuit assembly having a second pair of identical diodes in second anti-series configuration.

The method 300, at block 306, may include cancelling by the first switching circuit assembly a capacitance change wherein capacitance increases in a first diode of the first pair of identical diodes and, simultaneously, capacitance decreases in a second diode of the first pair of identical diodes with the first selectively applied RF voltage input.

The method 300, at block 308, may include cancelling by the second switching circuit assembly capacitance change wherein capacitance increases in a first diode of the second pair of identical diodes and, simultaneously, capacitance decreases in a second diode of the second pair of identical diodes with the second applied RF voltage input.

The cancelling by the first switching circuit assembly may include providing a path from the first throw output to the switch output which is devoid of a capacitor; and the cancelling by the second switching circuit assembly may include providing a path from the second throw output to the switch output which is devoid of a capacitor.

Figure 4:
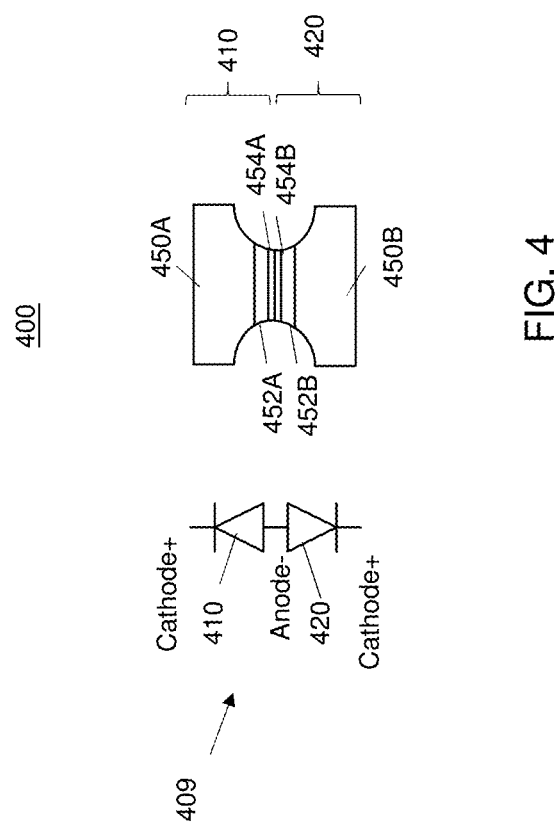
FIG. 4 illustrates a mesa to mesa die bare stack configuration of anti-series PIN diode stack.

FIG. 4 illustrates a mesa to mesa die bare stack configuration of anti-series PIN diode stack 409. The diode stack 409 includes a top diode 410 and a bottom diode 420. The top diode 410 includes a plurality of semi-conductor layers 450A, 452A and 454A. Likewise, bottom diode 420 includes a plurality of semi-conductor layers 450B, 452B and 454B. In the anti-series PIN diode stack 409, the semi-conductor layer 454A of diode 410 is generally directly next to or immediately adjacent to semi-conductor layer 454B of diode 420. The semi-conductor layer 454A is a mesa of diode 410. The semi-conductor layer 454B is a mesa of diode 420.

In some embodiments, the semi-conductor layer 454A and semi-conductor layer 454B may include p-type dopants to form p-type layers.

The semi-conductor layer 450A of top diode 410 and semi-conductor layer 450B of bottom diode 420 may include n-type dopants to form n-type layers. The semi-conductor layer 452A of top diode 410 and semi-conductor layer 452B of bottom diode 420 may be intrinsic layer without dopants to form undoped layers.

Figures 5A, 5B:
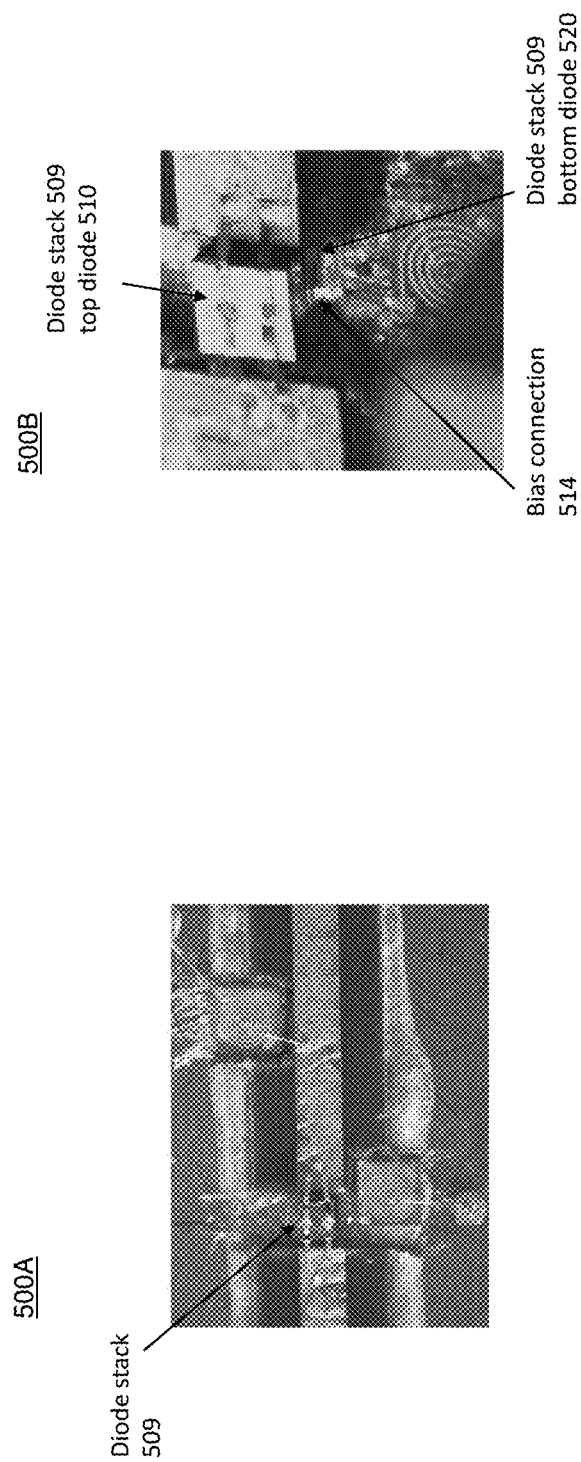
FIG. 5A illustrates an image of an integrated circuit including the anti-series PIN diode stack.
FIG. 5B illustrates an image of an integrated circuit of a top diode of the anti-series PIN diode stack.

FIG. 5A illustrates an image 500A of an integrated circuit including the anti-series PIN diode stack 509. FIG. 5B illustrates an image 500B of an integrated circuit of a top diode 510 of the anti-series PIN diode stack 509. The image 500B illustrates the bias connection 514 and the bottom diode 520 of the anti-series PIN diode stack 509 relative to the top diode 510.

Figure 6:
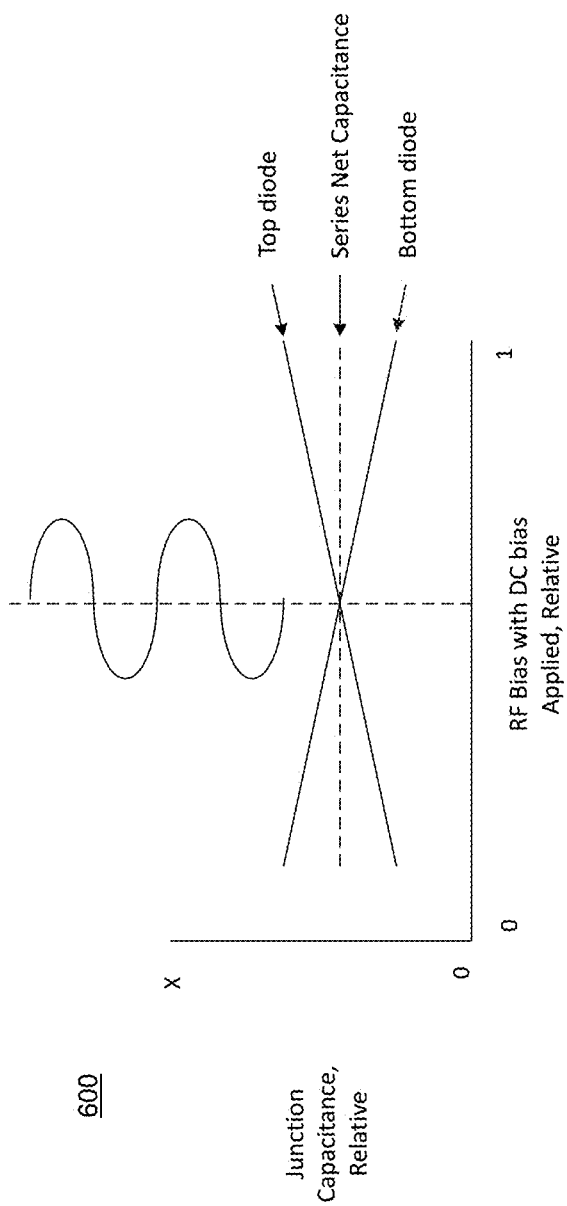
FIG. 6 illustrates a graphical representation of radio frequency (RF) bias with direct current (DC) bias verses junction capacitance.

FIG. 6 illustrates a graphical representation 600 of radio frequency (RF) bias with direct current (DC) bias verses junction capacitance.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms "first," "second," etc., does not denote any order or importance, but rather the terms "first," "second," etc., are used to distinguish one element from another.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

We claim:

1. A switch comprising:
a first switching circuit assembly having a first pair of identical diodes in first anti-series configuration, wherein an anode of a first diode of the first pair of identical diodes and an anode of the second diode of the first pair of identical diodes are coupled in series, the first switching circuit assembly constructed and arranged to cancel capacitance change wherein capacitance increases in a first diode of the first pair of identical diodes and, simultaneously, capacitance decreases in a second diode of the first pair of identical diodes with a first selectively applied radio frequency (RF) voltage input; and
a second switching circuit assembly having a second pair of identical diodes in second anti-series configuration, wherein an anode of a first diode of the first pair of identical diodes and an anode of the second diode of the first pair of identical diodes are coupled in series, the second switching circuit assembly constructed and arranged to cancel capacitance change wherein capacitance increases in a first diode of the second pair of identical diodes and, simultaneously, capacitance decreases in a second diode of the second pair of identical diodes with a second selectively applied RF voltage input.

2. The switch of claim 1, further comprising a switch output coupled to a first throw output of the first pair of identical diodes and a second switching output of the second pair of identical diodes wherein a path from the first throw output to the switch output is devoid of a capacitor; and a path from the second switching output to the switch output is devoid of a capacitor.

3. The switch of claim 1, wherein the first switching circuit assembly comprises:
the first diode having a cathode coupled directly to the input path;
the second diode having a cathode connected to ground; and
a first inductor coupled directly to the anode of the first diode and being configured to receive a first bias signal.

4. The switch of claim 3, wherein the second switching circuit assembly comprises:
the first diode having a cathode coupled directly to the input path;
the second diode having a cathode connected to ground; and
a second inductor coupled directly to the anode of the first diode and being configured to receive a second bias signal.

5. The switch of claim 4, further comprising:
a first switch input coupled to the cathode of the first diode of the first switching circuit assembly; and a second switch input coupled to the cathode of the first diode of the second switching circuit assembly wherein a path from the first switch input to the first throw output and to the switch output is devoid of a capacitor; and
a second switch input coupled to the cathode of the first diode of the second switching circuit assembly; and a second switch input coupled to the cathode of the second diode of the second switching circuit assembly wherein a path from the second switch input to the second throw output and to the switch output is devoid of a capacitor.

6. The switch of claim 4, wherein the first bias signal is a reverse bias signal.

7. The switch of claim 1, wherein the first selectively applied RF voltage input and the second selectively applied RF voltage input comprise a frequency in at least one of C-Band and X-Band and the switch operates on a multi-octave frequency band.

8. A system comprising:
transmitters configured to selectively transmit a first selectively applied radio frequency (RF) voltage input and a second selectively applied RF voltage input; and
a switch comprising:
a first switching circuit assembly having a first pair of identical diodes in first anti-series configuration, wherein an anode of a first diode of the first pair of identical diodes and an anode of the second diode of the first pair of identical diodes are coupled in series, the first switching circuit assembly constructed and arranged to cancel capacitance change wherein capacitance increases in a first diode of the first pair of identical diodes and, simultaneously, capacitance decreases in a second diode of the first pair of identical diodes with the first selectively applied RF voltage input; and
a second switching circuit assembly having a second pair of identical diodes in second anti-series configuration, wherein an anode of a first diode of the first pair of identical diodes and an anode of the second diode of the first pair of identical diodes are coupled in series, the second switching circuit assembly constructed and arranged to cancel capacitance change wherein capacitance increases in a first diode of the second pair of identical diodes and, simultaneously, capacitance decreases in a second diode of the second pair of identical diodes with the second applied RF voltage input.

9. The system of claim 8, wherein the switch further comprising a switch output coupled to a first throw output of the first pair of identical diodes and a second throw output of the second pair of identical diodes wherein a path from the first throw output to the switch output is devoid of a capacitor; and a path from the second throw output to the switch output is devoid of a capacitor.

10. The system of claim 9, wherein the first switching circuit assembly comprises:
the first diode having a cathode coupled directly to the input path;
the second diode having a cathode connected to ground; and
a first inductor coupled directly to the anode of the first diode and being configured to receive a first bias signal.

11. The system of claim 10, wherein the second switching circuit assembly comprises:
the first diode having a cathode coupled directly to the input path;
the second diode having a cathode connected to ground; and
a first inductor coupled directly to the anode of the first diode and being configured to receive a second bias signal.

12. The system of claim 11, further comprising:
a first switch input coupled to the cathode of the first diode of the first switching circuit assembly; and a second switch input coupled to the cathode of the first diode of the second switching circuit assembly wherein a path from the first switch input to the first throw output and to the switch output is devoid of a capacitor; and a second switch input coupled to the cathode of the first diode of the second switching circuit assembly; and a second switch input coupled to the cathode of the second diode of the second switching circuit assembly wherein a path from the second switch input to the second throw output and to the switch output is devoid of a capacitor.

13. The system of claim 10, wherein the first bias signal is a reverse bias signal.

14. The system of claim 8, wherein the first selectively applied RF voltage input and the second selectively applied RF voltage input comprise a frequency in at least one of C-Band and X-Band.

15. The system of claim 8, further comprising an antenna coupled to the transmitters via the switch.

16. A method comprising:
selectively transmitting, by transmitters, a first selectively applied radio frequency (RF) voltage input and a second selectively applied RF voltage input; and
switching by a switch, one of the first selectively applied RF voltage input and the second selectively applied RF voltage input to a switch output wherein the switch comprises:
a first switching circuit assembly having a first pair of identical diodes in first anti-series configuration, wherein an anode of a first diode of the first pair of identical diodes and an anode of the second diode of the first pair of identical diodes are coupled in series, and a second switching circuit assembly having a second pair of identical diodes in second anti-series configuration, wherein an anode of a first diode of the second pair of identical diodes and an anode of the second diode of the second pair of identical diodes are coupled in series;
cancelling by the first switching circuit assembly a capacitance change wherein capacitance increases in the first diode of the first pair of identical diodes and, simultaneously, capacitance decreases in the second diode of the first pair of identical diodes with the first selectively applied RF voltage input; and
cancelling by the second switching circuit assembly capacitance change wherein capacitance increases in the first diode of the second pair of identical diodes and, simultaneously, capacitance decreases in the second diode of the second pair of identical diodes with the second applied RF voltage input.

17. The method of claim 16, wherein the switch further comprising a switch output coupled to a first throw output of the first pair of identical diodes and a second throw output of the second pair of identical diodes and wherein:
the cancelling by the first switching circuit assembly includes providing a path from the first throw output to the switch output which is devoid of a capacitor; and
the cancelling by the second switching circuit assembly includes providing a path from the second throw output to the switch output which is devoid of a capacitor.

18. The method of claim 17, wherein the first switching circuit assembly comprises:
the first diode having a cathode coupled directly to the input path;
the second diode having a cathode connected to ground; and
a first inductor coupled directly to the anode of the first diode and being configured to receive a first bias signal.

19. The method of claim 18, wherein the second switching circuit assembly comprises:
the first diode having a cathode coupled directly to the input path;
the second diode having a cathode connected to ground; and
a first inductor coupled directly to the anode of the first diode and being configured to receive a second bias signal.

20. The method of claim 19, wherein the first selectively applied RF voltage input and the second selectively applied RF voltage input comprise a frequency in at least one of C-Band and X-Band.

* * * * *